(12) United States Patent
Kazama et al.

(10) Patent No.: US 6,639,315 B2
(45) Date of Patent: Oct. 28, 2003

(54) SEMICONDUCTOR DEVICE AND MOUNTED SEMICONDUCTOR DEVICE STRUCTURE

(75) Inventors: Atsushi Kazama, Chiyoda (JP); Hideo Miura, Koshigaya (JP); Akihiro Yaguchi, Iwama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/925,374

(22) Filed: Aug. 10, 2001

(65) Prior Publication Data

US 2002/0034872 A1 Mar. 21, 2002

(30) Foreign Application Priority Data

Sep. 19, 2000  (JP) .......................................... 2000-283880

(51) Int. Cl.[7] .............................................. H01L 23/48
(52) U.S. Cl. ........................ 257/738; 257/734; 257/737
(58) Field of Search ................................. 438/612, 613, 438/106, 107, 108; 257/734, 737, 738

(56) References Cited

U.S. PATENT DOCUMENTS

| 5,148,265 A | 9/1992 | Khandros et al. |
| 6,049,128 A | 4/2000 | Kitano et al. |
| 6,130,112 A | 10/2000 | Kitano et al. |

FOREIGN PATENT DOCUMENTS

| JP | 6-504408 | 5/1994 |
| JP | 6-224259 | 8/1994 |
| JP | 11-54649 | 2/1999 |
| JP | 11-204560 | 7/1999 |

*Primary Examiner*—Long Pham
(74) *Attorney, Agent, or Firm*—Antonelli, Terry, Stout & Kraus, LLP

(57) ABSTRACT

A small semiconductor device which can be fabricated at the wafer level has high reliability of external terminals with respect to distortion caused by differential thermal expansion between a semiconductor element of the device and a printed circuit board and has superior electrical performance achieved through reduced static capacitance of interconnections. A thick stress-moderating layer with a low elastic modulus is interposed between the semiconductor element and interconnections and lands and improves the reliability of external terminals by absorbing distortion caused by the differential thermal expansion. The thick stress-moderating layer also reduces static capacitance between the interconnections and internal interconnections of the semiconductor element. Even around element electrodes, where the stress-moderating layer is not formed, static capacitance is reduced by an insulating film interposed between the interconnections and the semiconductor element.

22 Claims, 5 Drawing Sheets

SEMICONDUCTOR DEVICE AND MOUNTED SEMICONDUCTOR DEVICE STRUCTURE

BACKGROUND OF THE INVENTION

This invention relates to a small semiconductor device having external terminals electrically connected to a semiconductor element, and to a mounted semiconductor device structure made by mounting this semiconductor device to a printed circuit board.

In recent years, as portable terminals have spread and accompanying reduction in the size and weight of various appliances using semiconductor devices has progressed, the development of semiconductor devices to facilitate this size reduction has become necessary.

In this connection, there is technology which aims to make the size of a semiconductor device approach the size of the semiconductor element on which it is based. A semiconductor device package based on this kind of technology is generally called A-CSP (Chip Size Package, or Chip Scale Package). In a typical CSP structure, metal bumps are disposed within the area of the face of the semiconductor element, and the semiconductor element is-mounted to a printed circuit board by way of these metal bumps. Solder is the material most commonly used for the metal bumps.

In a mounted semiconductor device structure made by mounting a CSP to a board like this, when a temperature change is applied, due to a linear expansion coefficient differential between the semiconductor element and the board, differential thermal expansion arises. Consequently, a thermal distortion occurs repeatedly in the solder bumps sandwiched between the semiconductor element and the board, and the solder bumps may suffer fatigue failure. Accordingly, securing a long life for solder connections in temperature cycle tests is an issue. As an example of a CSP in related art designed with the life of its solder parts in mind, in International Patent Publication No. 504408/1994 there is disclosed a CSP of a structure wherein a tape carrying external terminals is set on a cushion material (an elastomer resin) on the face of a semiconductor element on which a circuit is formed, and the external terminals are electrically connected to the electrodes of the semiconductor element. Because the soft elastomer resin deforms and absorbs thermal distortions, distortions arising in the solder bumps are reduced and their life is increased.

In Japanese Patent Laid-Open No. 224259/1994, a structure is disclosed wherein a semiconductor element is mounted on a ceramic board provided with through holes; electrodes are provided on the other side of the ceramic board; and this is mounted to a printed circuit board. In order to connect the semiconductor device to the printed circuit board via a ceramic board, since the structure reduces the area of electrodes for wire bonding around the semiconductor, the semiconductor package can become reduced in size.

Numerous semiconductor elements are formed at once on a single wafer, and each of the CSP examples above is based on the premise that individual semiconductor elements are processed after being cut from the wafer.

In recent years, technology has been developed for fabricating small semiconductor devices of the same size as their semiconductor elements at a lower cost by carrying out packaging operations on a plurality of semiconductor elements that are still in the wafer.

An example of a CSP which can be fabricated while still in the wafer state is proposed in Nikkei Micro Devices, April 1998: "New Method for Cheaply Making Promising Candidate CSP for Chip Size Mounting" (page 164 to page 167). In the semiconductor device discussed in this article, further interconnections are formed on the semiconductor element; metal via posts of height about 100 $\mu$m in height are formed on these interconnections; the space around the via posts is sealed with resin; and metal bumps are formed on the upper faces of the via posts with a barrier metal layer therebetween. A temporary film is spread on the face of via posts in a metallic mold in a process of sealing with resin, so the metallic mold can be removed easily from the sealing resin after pouring into the mold.

In a semiconductor device disclosed in Japanese Patent Laid-open No. 54649/1999, a low elastic modulus layer is formed on the main face of the semiconductor element with an opening over an electrode region where element electrodes are disposed; lands to constitute external electrodes are formed on the low elastic modulus layer; a metal interconnection pattern in which pads on the element electrodes are integrated with the lands and metal interconnections connecting them together is constructed; the surface is covered with solder resist; openings are formed above the lands, and metal balls are joined to the lands.

In this construction, thermal stresses can be absorbed by deformation of the low elastic modulus layer. And because the edges of the opening in the low elastic modulus layer are worked to sloping face shapes, stress concentrations in the metal interconnections are avoided and breakages are prevented.

Also, a passivation film for protecting the semiconductor element may be further provided in a region of the main face of the semiconductor element, excluding the pads. With this related art technology, it is considered that, if a modulus layer is used which is sufficiently low in elastic, modulus and sufficiently thick, the stress-moderating effect is higher than that of the structure described above using sealing resin.

In Japanese Patent Laid-Open No. 204560/1999 there is mentioned a structure wherein, in addition to the structure described above, a resin layer having a linear expansion coefficient between the linear expansion coefficients of the semiconductor element and the low elastic modulus layer is interposed between the two to prevent detachment from each other.

However, in the related art semiconductor devices described above, the following problems may arise.

In the related art semiconductor device discussed above, stresses caused by differential thermal expansion between the semiconductor element and the board on which it is mounted are absorbed by elastic deformation of a low elastic modulus layer; however, to secure sufficient reliability of the metal bumps by this method, it is likely that it will be necessary to make the low elastic modulus layer considerably thick.

In a related art semiconductor device above, a thickness of 10 to 150 $\mu$m is considered desirable. And, the opening is formed after the low elastic modulus layer is first formed flat, and exposed, for example, by using scattered light so that the side faces of the opening are not vertical, but rather are sloping.

However, when this kind of process is carried out on a thick film of, for example, a thickness of 100 $\mu$m or more, to control the shape of the side faces and to control the bottom end of the opening to dimensions close to the edge of a fine element electrode requires extremely high-precision working technology.

When considered to be semiconductor devices are manufactured on in the related art, at the stage of forming the thick low elastic modulus layer over the entire face of the wafer, the wafer warps severely. As a result, carrying out the highly precise working mentioned above on all of the chips on the warped wafer-is difficult.

Also, as another issue, in a CSP fabricated at the wafer level, there is the problem of its electrical characteristics. That is, when manufacturing a CSP at the wafer level, as a result of problems such as warping of the wafer, it is difficult to form a very thick resin layer, and the insulating layer interposed between the interconnections of the package and the semiconductor element tend to become thin, and the interconnection capacitance tends to become large.

When the interconnection capacitance becomes large, severe noise arises in the signal lines, and there is a risk of the device malfunctioning. Consequently, securing the thickness of the insulating film between the package interconnections and the semiconductor element surface becomes an issue.

The technology set forth in Japanese Patent Laid-Open No. 204560/1999 relates to a semiconductor device wherein a resin layer is interposed between a semiconductor chip and a low elastic modulus layer. Here, because the differences in the elastic modulus and the linear expansion coefficients of the semiconductor chip and the low elastic modulus layer are large, to prevent stresses concentrating at the interface between the two and cracking or detachment consequently occurring, a resin film leaving an elastic modulus and a linear expansion coefficient between those of the semiconductor chip and the low elastic modulus layer is interposed between them.

The resin film in the semiconductor device set forth in Japanese Patent Laid-Open No. 204560/1999; formed between a semiconductor chip and the low elastic modulus layer, the detail of the opening is not disclosed. The resin film has an opening in a region where element electrodes are disposed, and because the edge of that opening is in substantially the same position as or in a position further away than the edge of the opening in the low elastic modulus layer as seen from the center of an element electrode, interconnections are formed directly on the passivation film around the element electrodes.

When interconnections are formed directly on the passivation film like this, because the passivation film is an inorganic film which is difficult to make thick, the static capacitance between the interconnections and the passivation film is large.

In this case, when in the future the operation of semiconductor devices has become faster, there is a risk of the static capacitance between the interconnections and the passivation film causing the device to malfunction.

In this related art semiconductor device, at the periphery of the device, the semiconductor element edge and the edges of the low elastic modulus layer and the solder resist all coincide. Consequently, when this semiconductor device is fabricated at the wafer level, in the final dicing of the wafer into individual semiconductor devices, the resin film and the semiconductor element, whose hardnesses differ greatly, are cut simultaneously. When this happens, there is a risk of the resin film and the semiconductor element suffering damage at their interface. This leads to the possibility of cracking occurring in the semiconductor element and detachment occurring at the interface.

SUMMARY OF THE INVENTION

It is therefore an object of the present invention to solve the problems described above and to realize a semiconductor device which is highly reliable, has superior electrical characteristics, and which can be manufactured at the wafer level, and to realize a mounted semiconductor device structure including this semiconductor device.

To achieve this object and other objects, the invention provides the following basic constructions.

(1) A semiconductor device having a semiconductor element, including: element electrodes formed on the semiconductor element surface; a passivation film formed on the semiconductor element surface and having openings above the element electrodes; conducting lands for external terminals to be joined to; a stress-moderating layer interposed between the passivation film and the lands, and having an opening above the element electrodes with its edges forming sloping faces; an insulating film interposed between the passivation film and the stress moderating layer, and having openings above the element electrodes; conducting interconnections electrically connecting the element electrodes with the lands; a surface protection film formed at the ultimate surface of the semiconductor device and having openings above the lands; and external terminals joined to the lands, wherein the distances from the centers of the element electrodes to the edges of the openings formed in the passivation film, the insulating film, and the stress-moderating layer increase in the order of the insulating film, the passivation film, and the stress-moderating layer.

(2) Preferably, in (1) above, at the peripheral sides of the semiconductor device, the edges of the insulating film, the stress-moderating layer, and the surface protection film are all formed inside the edge of the semiconductor element.

(3) And preferably, in (1) or (2) above, the surface protection film is thicker at the element electrodes, where the stress-moderating layer is not present, than on the flat part of-the stress-moderating layer.

(4) And preferably, in (1) to (3) above, the element electrodes include a power supply pad, a ground pad. Also, a signal pad, and a power supply interconnection and a ground interconnection led out from the power supply pad and the ground pad are thicker than a signal interconnection led out from the signal pad.

(5) A mounted semiconductor device structure made by mounting a semiconductor device, according to any one of (1) through (4) by way of the external terminals, to a printed circuit board having conducting lands for the external terminals to be joined to, conducting interconnections interconnecting the lands, and a surface protection film formed at the ultimate surface of the printed circuit board with openings above the lands.

(6) A mounted semiconductor device structure made by mounting a semiconductor device having at least a semiconductor element, conducting lands for electrically connecting the semiconductor element to the outside, a surface protection film formed at the ultimate surface of the semiconductor device with openings above the lands, and external terminals joined to the lands by way of the external terminals to a printed circuit board having at least conducting lands for joining external electrodes to, and a surface protection film having openings above these lands. On the semiconductor device side, the openings in the surface protection film are formed inside the edges of the lands. On the printed circuit board side, the lands are formed inside the edges of the openings in the surface protection film. The diameter of the lands on the printed circuit board side is smaller than the diameter of the openings in the surface protection film on the semiconductor device side.

(7) Preferably, in (5) above, on the semiconductor device side, the openings in the surface protection film are formed inside the edges of the lands, and on the printed circuit board side the lands are formed inside the edges of the openings in the surface protection film, and the diameter of the lands on the printed circuit board side is smaller than the diameter of the openings in the surface protection film on the semiconductor device side.

(8) A mounted semiconductor device structure made by mounting a plurality of semiconductor devices, each according to any one of (1) to (4) above to a printed circuit board according to (5) above.

(9) A mounted semiconductor device structure made by mounting a plurality of semiconductor devices, each according to any one of (1) to (4) above, to a printed circuit board according to (7) above.

In a semiconductor device according to the invention, the passivation film is an inorganic film of sin or $SiO_2$ formed to protect the semiconductor element, and its thickness is 1 $\mu$m at the most.

The thick stress-moderating layer is formed to a thickness of 40 $\mu$m or more using a low elastic modulus resin material having a modulus of longitudinal elasticity of 2000 MPa or less. Because distortions caused by differential thermal expansion between the semiconductor element and the printed circuit board, when the semiconductor device is mounted to a printed circuit board, are absorbed by this stress-moderating layer, distortions arising in the external terminals are reduced and high reliability is realized.

The stress-moderating layer is formed by being applied to parts other than the element electrodes using a printing method. Because the openings are already forming at the application stage, the step of removing material to make the opening is not necessary and consequently the above-mentioned problem that it is difficult to work a warped wafer does not arise.

Also, the edges of the opening in the applied stress-moderating layer flow and form gently sloping faces. As a result of the edges forming sloping faces, even if the stress-moderating layer is thick, forming interconnections over its step is easy and stress concentrations at the parts of interconnections formed over the step parts are reduced and the reliability of the interconnections is high.

On the other hand, because at the parts where the edges flow to form sloping faces the distances are relatively large, controlling the dimensions of the opening with high precision is difficult. To make the opening over the element electrodes with certainty, it is necessary to form the edges of the opening in the stress-moderating layer in positions well away from the element electrodes.

At this time, when the stress-moderating layer is not formed in the vicinity of the element electrodes, but instead near the feet of the sloping faces of the stress-moderating layer, because the distance between the interconnections and the semiconductor element surface is small, there is a risk of the static capacitance of interconnections at these locations being large.

To avoid this, in this invention, an insulating film interposed between the stress-moderating layer and the passivation film is formed, and by this insulating film being interposed between the interconnections and the semiconductor element surface, even in the vicinities of the element electrodes, increased interconnection capacitance is prevented and a semiconductor device having superior electrical characteristics is realized.

The thickness of the insulating film is adjusted to suit the electrical characteristics required of the semiconductor device, and is made about 3 to 20 $\mu$m. Over the element electrodes, the openings in the insulating film are formed inside the openings in the passivation film.

As a result, interconnections led out from the element electrodes immediately pass up onto the insulating film, without passing over the passivation film, and this is advantageous to the electrical characteristics of the device. Also, when the openings in the passivation film are formed on the inside, because the edges of the passivation film project beyond the edges of the insulating film, stress concentrations arise in the interconnections at these parts, and there is a risk of the interconnections breaking. And, because it is necessary to form openings above fine element electrodes, a high-precision method such as photolithography, for example, is used for the openings in the insulating film.

The insulating film in the semiconductor device of this invention is interposed between the interconnections near the element electrodes and the semiconductor element surface, and is formed to reduce the static capacitance of the interconnections.

The semiconductor device of this invention can be manufactured at the wafer level, and can be manufactured by the following process, for example.

That is, the present invention relates to a structure of a small semiconductor device which can be manufactured while still in the wafer state, wherein by interposing a thick stress-moderating layer with a low elastic modulus between a semiconductor element and interconnections and lands, it is possible to absorb distortions caused by differential thermal expansion between the semiconductor element and a printed circuit board in temperature cycles, and thereby improve the reliability of external terminals and also improve the electrical performance of the device by reducing static capacitances between interconnections inside the semiconductor element and other interconnections of the device.

In addition, by virtue of an insulating film being interposed between interconnections and the semiconductor element, around the element electrodes, where the stress-moderating layer is not formed, the, static capacitance of these parts is also reduced.

On the surface of a wafer on which numerous semiconductor elements have been formed, a passivation film with openings over element electrodes is formed. On this passivation film, first, a light-sensitive resin material which is to become an insulating film, is applied to the wafer face by spin coating, and openings are formed in this over the element electrodes by photolithography.

Then, a resin material to become a stress-moderating layer is applied to the wafer face by printing. A screen mask used during the printing has a pattern masking the region where the element electrodes are formed, and an opening is formed in this element electrode formation region simultaneously with the printing. After being left to stand until the edges of the stress-moderating layer have flowed and become sloping faces, the wafer is dried.

Next, lands on the stress-moderating layer and interconnections connecting the element electrodes to the lands are formed en bloc on the wafer face using thin film processes as follows: A metal film is formed on the wafer face by sputtering; photoresist is applied to this by spin coating; a pattern of openings for interconnections and lands is formed in this by photolithography; interconnections and lands are formed by electroplating with this resist pattern as a guide; the photoresist is removed; and the metal film is removed by etching to leave plated parts constituting interconnections and lands.

Then, a light-sensitive resin material to become a surface protection film is formed on the wafer face by, for example, spin coating or printing, and openings are formed in it over the lands by photolithography. Solder balls are then deposited in the openings over the lands using a mask, and are joined to the lands by reflowing. Finally, the wafer is diced into individual semiconductor devices.

When a semiconductor device, according to the invention, is made by wafer processes like this, finally the wafer must be cut up with a dicer to separate the individual semiconductor devices. And when resin layers such as the insulating film, the stress-moderating layer, and the surface protection film are present on the lines to be cut with a cutter (called scribe lines), resin films and the semiconductor element, which have greatly different hardnesses, are cut at the same time. When this happens, there is a risk of detachment occurring at the interface between the resin films and the semiconductor element, and of damage such as cracking of the semiconductor element occurring near the interface.

To avoid this, in the semiconductor device of this invention, preferably, the edges of the semiconductor device, the edges of the insulating film, the stress-moderating layer and the surface protection film are all formed inside the edges of the semiconductor element. When this is done, no resin film is present in the scribe area and damage that can occur during dicing can be reduced.

In the semiconductor device of the present invention, because the main surface of the semiconductor element is covered with a thick stress-moderating layer, α-rays produced by the solder bumps and light entering from outside, which both can be causes of the semiconductor device malfunctioning, are blocked, and the semiconductor device is highly reliable with respect to α-rays and light.

However, because the stress-moderating layer is not present in the element electrode formation region, the incursion of α-rays and light is potentially an issue. In the semiconductor device of this invention, because an insulating film is formed in the element electrode formation region, α-rays and light are blocked to some extent by this insulating film.

However, when the thickness of the insulating film is insufficient, preferably, the thickness of the surface protection film is made greater in the element electrode formation region than it is over the flat part of the stress-moderating layer, thereby providing a combined thickness of the insulating film and the surface protection film sufficient to block α-rays and light.

By means of the construction described above, it is possible to secure reliability of the external terminals and realize a semiconductor device which also has excellent electrical characteristics and resistance to α-rays and light, and which can be fabricated en bloc at the wafer level at low cost.

Finally, in a mounted semiconductor device structure made by mounting a semiconductor device according to the invention to a printed circuit board, by adopting a structure wherein lands on the printed circuit board side project into the external terminals and making these lands small in diameter, it is possible to further improve the reliability of the external terminals and to make the pitch of the external terminals narrow.

DETAILED DESCRIPTION OF THE PREFERRED EMBODIMENTS

Preferred embodiments of the invention will now be described, with reference to the accompanying drawings.

Figure 1:
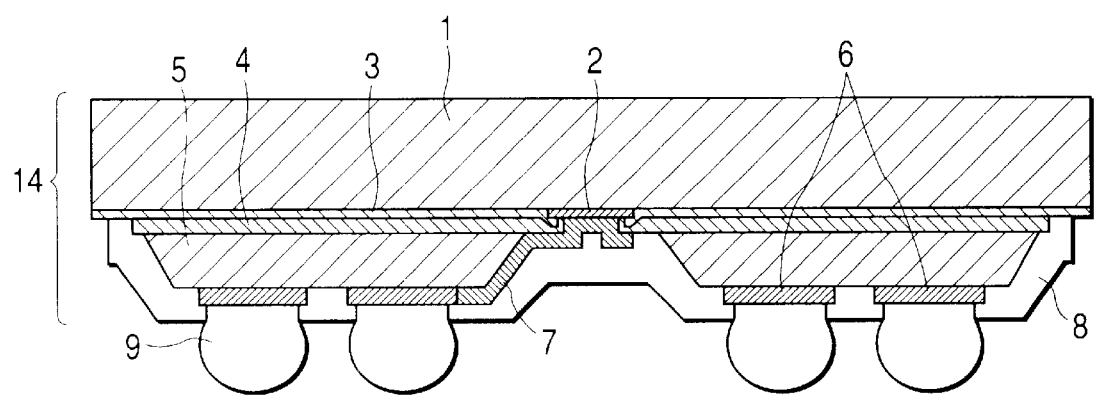
FIG. 1 is a sectional view showing a semiconductor device of a first preferred embodiment of the invention.
Figure 2:
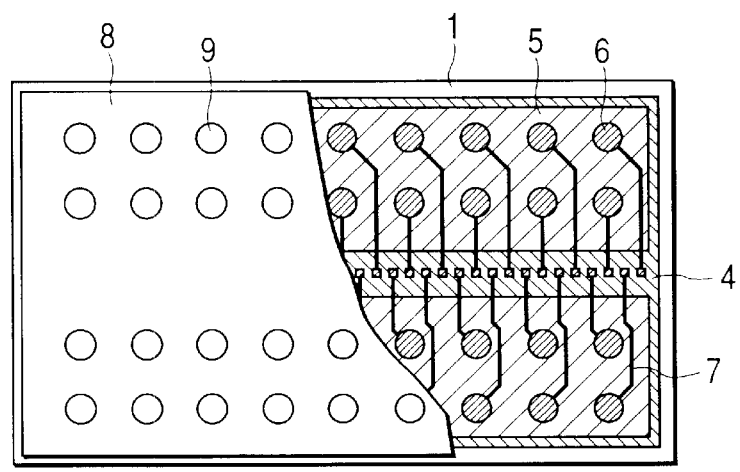
FIG. 2 is a plan view showing the semiconductor device of the first preferred embodiment.

The first preferred embodiment of a semiconductor device according to the invention will be described using FIG. 1 and FIG. 2. FIG. 1 is a sectional view showing the first preferred embodiment, and FIG. 2 is a plan view showing the first preferred embodiment with external terminals and a surface protection film partly removed.

The semiconductor device 14 of this first preferred embodiment has a semiconductor element 1, element electrodes 2 formed: on the surface of the semiconductor element 1, a passivation film 3 formed on the surface of the semiconductor element 1 and having openings above the element electrodes 2, an insulating film 4 formed on the passivation film 3 so as to expose the element electrode 2 surfaces, a stress-moderating layer 5 formed on the insulating film 4 so as to expose the element electrodes 2, conducting lands 6 formed on the stress-moderating layer 5, conducting interconnections 7 connecting the element electrodes 2 with the lands 6, a surface protection film 8 formed on the most surface of the semiconductor device 14 and having openings over the lands 6, and conducting external terminals 9 joined to the lands 6.

The edges of the openings formed in the passivation film 3, the insulating film 4, and the stress-moderating layer 5 are formed so that their distances from the centers of the element electrodes 2 increase in the order of: the insulating film 4, the passivation film 3, and the stress-moderating layer 5.

Numerous structures of devices such as capacitors, interconnection layers connecting them, and insulating layers are formed inside the semiconductor element 1. Element electrodes 2 are provided on a surface of the semiconductor element for electrically connecting it to the outside. The semiconductor element is covered with a thin inorganic passivation film 3 having openings above the element electrodes 2.

The first preferred embodiment of the invention is illustrated here using the example of a case wherein the element electrodes are lined up in a single row in the middle of the semiconductor element 1.

In the semiconductor device of this invention, the lands 6 for connecting to the external terminals 9 are formed on the stress-moderating layer 5, and, underneath all of the external terminals 9, the stress-moderating layer 5 is interposed between the external terminals 9 and the semiconductor element 1. The stress-moderating layer 5 is formed to be a thick layer of a material having a low elastic modulus. As a result, thermal distortion caused by differential thermal expansion between the semiconductor element 1 and the printed circuit board, when the semiconductor device of this first preferred embodiment of the invention is mounted on a printed circuit board and used, is absorbed by the stress-moderating layer 5, and the life of the external terminals 9 with respect to temperature cycles is improved.

The edges of the opening in the stress-moderating layer 5 are-formed as gently sloping faces. Consequently, compared to. when the edges are vertical, because forming interconnections (over the step of the thick stress-moderating layer 5) is easy, and stress concentrations in the parts of the interconnections formed on the step parts are lowered, the interconnections have high reliability.

To form the opening in the thick stress-moderating layer 5 and make the edges of the openings sloping faces, the stress-moderating layer is formed using a printing method. By forming a pattern masking the regions where the element electrodes 2 are to be formed in a screen mask to be used for printing, the opening is formed simultaneously with printing, and the edges flow after printing and naturally assume the form of sloping faces.

When the semiconductor device of this invention is to be manufactured at the wafer level, for example, if a method is used wherein the stress-moderating layer is formed flat on the wafer face and the opening is then made by a removal process using photolithography or the like, there is a risk of the wafer warping greatly at the stage of forming the flat stress-moderating layer, and it is difficult to perform the removal process with high precision. Also, forming the edges as gently sloping faces is difficult.

To overcome this, by using a printing method so that the opening is formed simultaneously with the application of the material, there ceases to be the above-mentioned problem of warping of the wafer, and the sloping faces can also be formed efficiently. And, because the step of a removal process is dispensed with, the cost can be reduced.

The insulating film 4 is made of an insulating resin material, and is formed between the interconnections 7 and the surf ace of the semiconductor element 1 with the object of reducing the static capacitance between them.

In a semiconductor device wherein, as in this invention, thin films are formed in layers on a semiconductor element, since the interval is close between interconnections of the semiconductor device and interconnections inside the semiconductor element there is a risk of the static capacitance between them becoming large. There is also a risk of noise in signal lines increasing; and of the device malfunctioning.

In the semiconductor device of this invention, because the thick stress-moderating layer 5 is interposed between the large parts of the interconnections 7 and the semiconductor element 1, the static capacitance of these parts is reduced. However, because the stress-moderating layer 5 is formed by a printing method, as described above, the parts that flow and form sloping faces in the edges are relatively large, and it is difficult to control the positions of the edges with high accuracy. Because of this, to make sure that the stress-moderating layer 5 has an opening above the element electrodes 2, the edges of the stress-moderating layer 5 are formed in positions well away from the element electrodes 2.

Consequently, if the stress-moderating layer 5 is not formed in the vicinity of the element electrodes 2 and at the parts of a feet of the sloping faces of the stress-moderating layer 5, the distance between the interconnections 7 and the semiconductor element 1 is small, and there is a risk of interconnection capacitances at these parts being large.

To avoid this, by forming the insulating film 4 so as to be interposed between the interconnections 7 and the semiconductor element 1 in the vicinity of the element electrodes 2, it is possible to reduce the interconnection capacitances at these parts and realize a semiconductor device having superior electrical characteristics.

The openings in the insulating film 4 are formed inside the openings in the passivation film 3. This is advantageous to the electrical characteristics of the device because it means that the interconnections led out from the element electrodes is located on the insulating film 4 immediately, without being located on the passivation film 3. Also, when the openings in the passivation film 3 are formed on the inside, because the edges of the passivation film 3 project beyond the edges of the insulating film 4, stress concentrations arise in the interconnections 7 at these parts, and there is a risk of the interconnections 7 breaking.

The thicker the insulating film 4 is, the greater its effect of reducing static capacitance will be; however, because openings must be formed (in the insulating film 4) above the fine element electrodes 2, and a high-precision working method such as, for example, photolithography is used, the insulating film 4 is not formed as thickly as the stress-moderating layer 5. In accordance with the level of the electrical characteristics required of the semiconductor device, the thickness of the insulating film 4 is adjusted between, for example, about 3 and 20 $\mu$m.

Here, when $\alpha$-rays arising from the external terminals and light incident from the outside environment reach the semiconductor element, they sometimes cause the device to malfunction. In the semiconductor device of this invention, $\alpha$-rays and light can be sufficiently blocked by the thick stress-moderating layer 5.

Although in the vicinity of the element electrodes 2, the stress-moderating layer 5 is not present or is thin and sloping, the insulating film 4 is formed at these parts and blocks $\alpha$-rays and light with its thickness combined with that of the surface protection film 8.

Here, in the step of forming the surface protection film 8, when a method of applying the material by spin coating or printing or the like, somewhat more material flows into the opening at the element electrodes 2 than at the flat part of the stress-moderating layer 5; consequently the surface protection film 8 is thicker at this openings than at the flat part, and compensates for thinness of the resin films around the element electrodes 2.

In this way, it is possible to realize a semiconductor device with a the good effect of blocking $\alpha$-rays and light.

The process of manufacturing the semiconductor device of this invention up to the formation of the external terminals 9 can be carried out at the wafer level, and, by this means, it is possible to reduce the cost of the manufacturing process.

When a wafer-level manufacturing process is used, it is necessary to dice the wafer after the external terminals 9 are formed. The material of the semiconductor element 1 may, for example, be a material consisting mainly of Si or a compound semiconductor such as GaAs or InP, and when such semiconductor elements are cut apart, if the resin films of the insulating film 4, the stress-moderating layer 5, and the surface protection film 8 are present on the scribe lines to be cut and are cut simultaneously with the hard semiconductor elements 1, there is a risk of damage arising to their edges during cutting, a risk of cracks forming in the edges of the semiconductor elements 1, and also a risk of detachment occurring between the semiconductor elements 1 and the resin films. Because of this, preferably, at the edges of each semiconductor device, the insulating film 4, the stress-moderating layer 5, and the surface protection film 8 are formed inside the edges of the semiconductor element 1, so that these resin films are not present on the scribe lines.

The present inventors carried out actual trials to determine that a semiconductor device having the structure of this first preferred embodiment can be manufactured on the wafer at the wafer-level and that it has high reliability.

The semiconductor device manufacturing process that was tested will be described below.

A light-sensitive resin material was applied by spin coating to an Si wafer on which numerous semiconductor elements had been formed, and the resin of openings over the element electrodes 2 and on scribe lines was removed to form the insulating film 4 by photolithography.

The stress-moderating layer 5 was then formed by printing, using a screen mask masking the vicinity of the element electrodes 2 and the scribe lines, and left to stand for a period of time. The stress-moderating layer 5 was then dried to form a shape having sloping faces at the edges.

A metal film was then formed over the entire face of the wafer by sputtering with Cr and Cu; a light-sensitive plating resist was applied to this by spin coating; by photolithography the resist at pattern parts for interconnections 7 and lands 6 was removed; the interconnections 7 and the lands 6 were formed by electric plating of Cu and Ni; the plating resist was removed; and the metal film remaining on parts other than the pattern parts for the interconnections 7 and the lands 6 was removed by etching to leave the interconnections 7 and the lands 6.

A light-sensitive resin material was then applied by spin coating to form a surface protection film, and the resin of openings above the lands 6 and on the scribe lines was removed.

Flux was then applied to the openings over the lands 6; balls of a solder were placed on this as the external terminals 9; and the wafer was heated in a reflow oven to melt the solder and join it to the lands 6.

Finally, the wafer was cut along the scribe lines using a dicing apparatus to produce individual semiconductors.

The manufacturing process and the materials of the constituent members are not limited to those described above, and as long as the object of forming each constituent member can be achieved and its shape can be formed, different materials and processes can be selected.

For example, the wafer on which the semiconductor elements are formed does not have to be Si, and, alternatively, a compound of Si such as SiGa, or a compound semiconductor such as GaAs or InP may be used. For the element electrodes 2, the lands 6 and the interconnections 7, materials such as copper (Cu), aluminum (Al) and chrome (Cr) may be used singly or in alloys in which a plurality of them are used, and their surfaces may be plated with nickel (Ni), or gold (Au) or the like. The material of the insulating film 4, the stress-moderating layer 5, and the surface protection film 8 may for example be a polyamide resin, a polyimide-amide resin, a polyethylimide resin, a polyethylimide-amide resin, an acryl-modified epoxy resin, an epoxy resin with rubber blended in, or a silicone resin.

For the external terminals 9, for example, an Sn—Pb, Sn—Ag—Cu, or Sn—Ag—Cu—Bi solder material is used.

Figure 3:
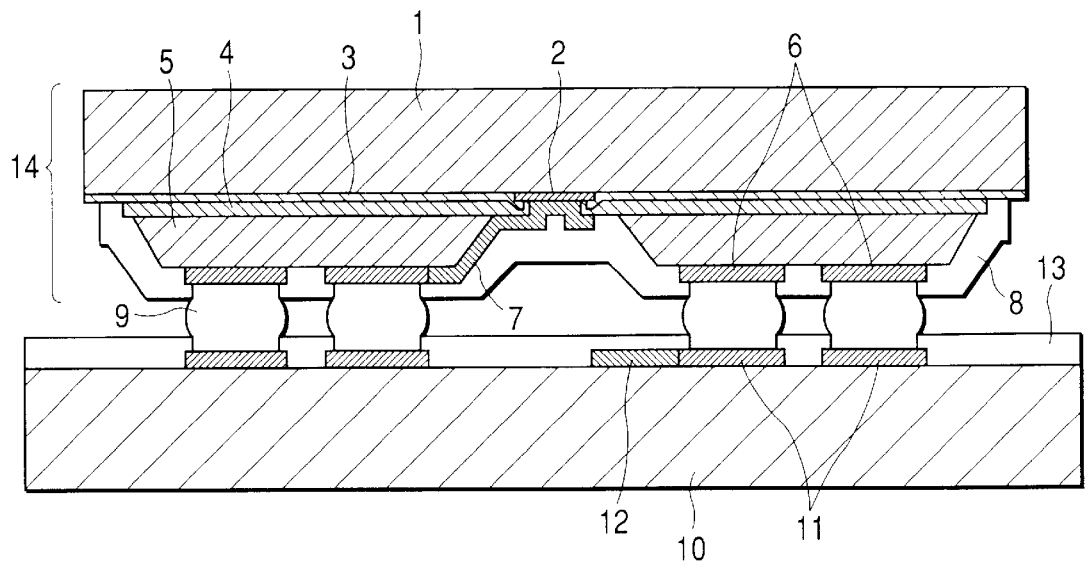
FIG. 3 is a sectional view showing a mounted semiconductor device structure made by mounting the semiconductor device of the first preferred embodiment to a printed circuit board.

FIG. 3 is a sectional view of a semiconductor device according to the first preferred embodiment of the invention mounted to a printed circuit board.

In FIG. 3, a printed circuit board 10 has lands 11 for connecting the external terminals 9 to. It is has a surface protection-film 13 formed on its surface, and this surface protection film 13 has openings above the lands 11. Conducting interconnections 12 (shown only in part in FIG. 3) interconnect the lands 11 within the printed circuit board 10. Before a trial evaluation, the present inventors investigated the relationship between the temperature cycle life of the external terminals 9 and the thickness and the elastic modulus of the stress-moderating layer 5, using a finite element method simulation.

Figure 4:
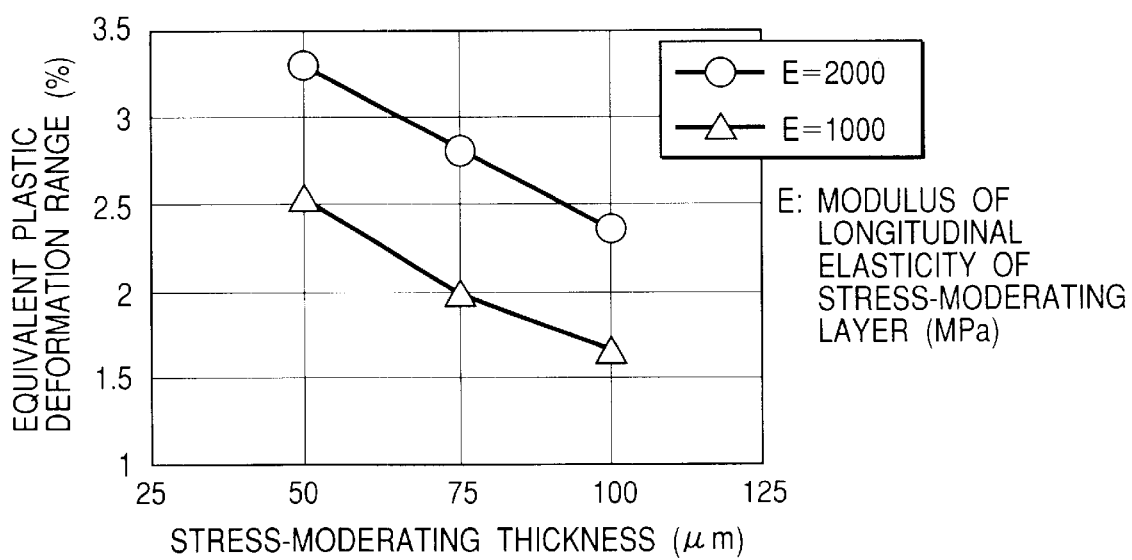
FIG. 4 is a graph showing a relationship between the modulus of longitudinal elasticity and the thickness of a stress-moderating layer and the distortion arising in element electrodes.

The results are shown in the graph of FIG. 4. The horizontal axis of FIG. 4 shows the thickness of the stress-moderating layer 5, and the vertical axis shows the variation of the maximum value of the range of equivalent plastic deformation arising in the external terminals 9 with the thickness and the modulus of longitudinal elasticity of the stress-moderating layer 5.

As can be seen from FIG. 4, the thicker the stress-moderating layer 5 is, and the smaller its modulus of elasticity is, the lower the deformation arising in the external terminals 9 is and the longer their life will be. However, the specifications of the stress-moderating layer 5 required to obtain a certain definite reliability level vary with the size and the material of the semiconductor element 1, the size and the material of the external terminals 9, and the linear thermal expansion coefficient of the printed circuit board 10.

The larger the size of the semiconductor element 1, and the greater the difference in linear thermal expansion coefficient between the semiconductor element 1 and the printed circuit board 10, and the smaller the size of the external terminals 9, the thicker or the smaller in modulus of elasticity the stress-moderating layer 5 should be made.

The present inventors mounted a semiconductor device produced for trials on a board for test use and carried out a temperature cycle test to evaluate the reliability of the semiconductor device of the invention. The size of the semiconductor element was about 10 mm square, the size of the solder balls constituting the external terminals was about 400 $\mu$m in diameter, a general-purpose FR-4 board was used as the board, and the linear thermal expansion coefficient of the board was approximately $15 \times 10^{-6}/°$ C.

When a $-55$ to $125°$ C. temperature cycle test was carried out, the result was that with specifications wherein the modulus of longitudinal elasticity at room temperature ($25°$ C.) is about 2000 MPa and the thickness of the flat part is about 75 $\mu$m, and with specifications wherein the modulus of longitudinal elasticity is about 900 MPa and the thickness is about 40 $\mu$m, the life of the external terminals was about 1000 cycles.

With specifications of modulus of longitudinal elasticity about 900 MPa, and thickness about 70 $\mu$m, the life was about 2500 cycles. And with specifications wherein no stress-moderating layer 5 was formed at all, the life was about 350 cycles.

From these results, it can be seen that forming the stress-moderating layer 5 has the effect of improving the life of the external terminals 9, and that the semiconductor device of this invention has high reliability. And that, to obtain a life of over 1000 cycles, a thickness of the flat part of the stress-moderating layer 5 of at least about 40 $\mu$m is necessary.

In the semiconductor device of the invention, wherein the interconnections 7 and the lands 6 are formed on a soft stress-moderating layer 5, since the lower the elastic modulus of the stress-moderating layer 5 is the more the interconnections 7 ana the lands 6 deform along with deformation of the stress-moderating layer 5. If the elastic modulus of the stress-moderating layer 5 is too low, there is a risk of them breaking. However, with the specifications of the trial production mentioned above, it was confirmed that breakage of the interconnections 7 and the lands 6 does not occur. Thus, the semiconductor device of the invention can provide reliability of the interconnections 7 and the lands 6.

The board on which the trial production devices were mounted is an inexpensive one of conventional design.

Because the pitch of the semiconductor device of the invention is widened by the interconnections 7 being led out from the narrowly pitched element electrodes 2, a board with a narrow pitch can be not necessary, and because the life of the external terminals 9 is increased by the stress-moderating layer 5 absorbing thermal distortions, a board with low thermal expansion or underfilling after mounting to the board can be also unnecessary; that is, the invention has the characteristic of high reliability, even with mounting by solder ref low only to an ordinary, inexpensive board. In order to decrease the static capacitance, the embodiment has an insulating film 4 formed at least around the element electrode 2, a stress-moderating layer 5 formed on the insulating film 4 around the element electrode 2 and interconnections 7 formed adjacent the insulating film 4 and the stress-moderating layer 5 is formed without extreme precision, the interconnections 7 are formed at a distance from the semiconductor device. As a result, the embodiment prevents undesirable high static capacitance.

Figure 5:
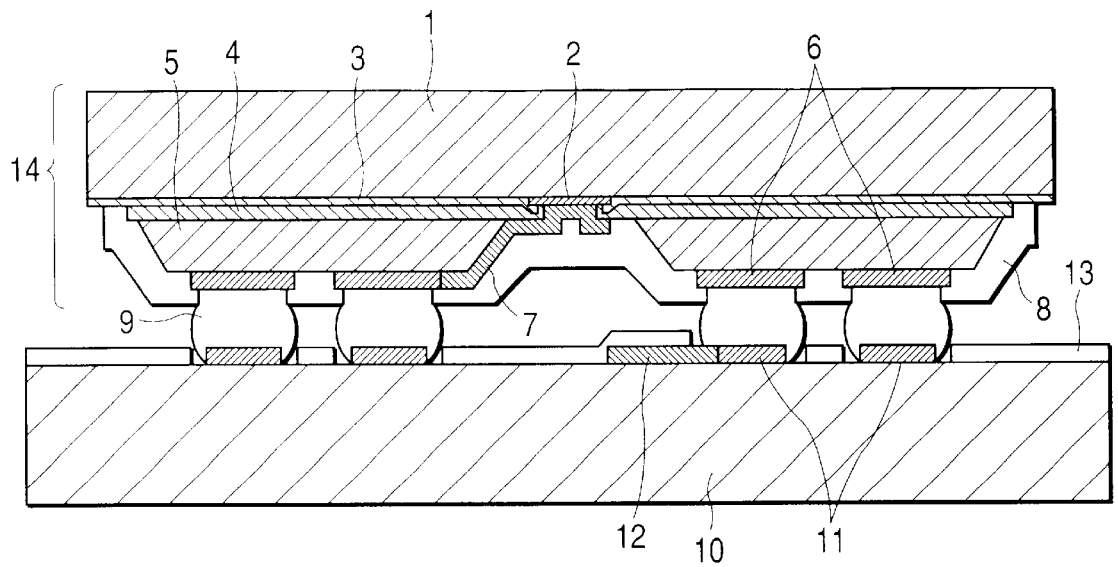
FIG. 5 is a sectional view showing a semiconductor device board-mounting structure of a second preferred embodiment of the invention.

FIG. 5 is a sectional view of a semiconductor device according to the second preferred embodiment of the invention mounted to a board.

The difference between the structure of this second preferred embodiment and the structure of the example shown in FIG. 3 is that on the printed circuit board 10 side the diameter of the openings formed in the surface protection film 13 is larger than the diameter of the lands 11, and when the external terminals 9 have been joined to these lands 11, the lands 11 project into the external terminals 9.

Figure 6A:
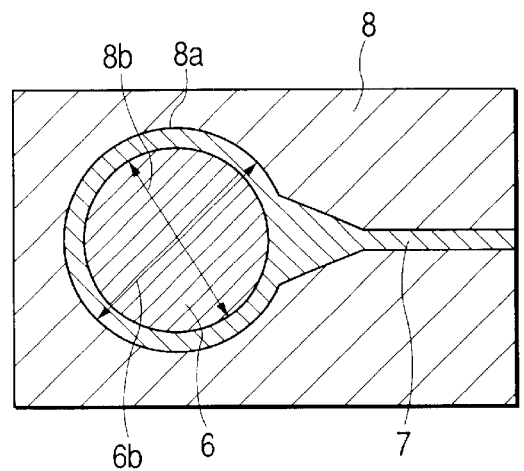
FIG. 6 is a plan view showing a relationship between lands and opening in a surface protection film in the second preferred embodiment.
Figure 6B:
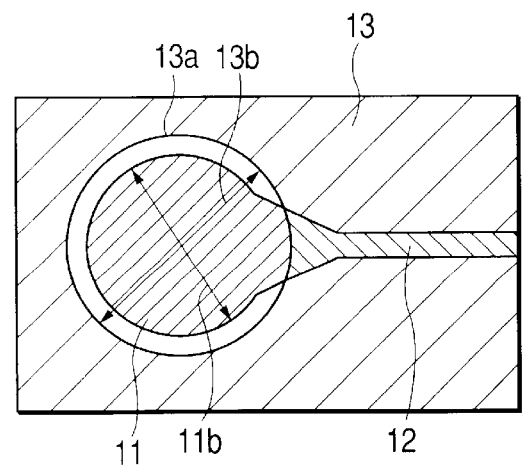

FIGS. 6A and 6B are plan views showing the relationship between the lands 11 and the surface protection film 13. FIG. 6A is a plan view of the semiconductor device 14 side, and FIG. 6B is a plan view of the printed circuit board 10 side. As shown in these figures, the interconnections 7 and the interconnections 12 are normally made wider near their connections to the lands 6 and the lands 11 to strengthen the connecting parts. Here, the lands are shown as circular parts.

As shown in FIG. 6A, on the semiconductor device 14 side, the opening 8a in the surface protection film 8 is formed on the lands 6 inside the edge of the lands 6, and the diameter 8b of the opening in the surface protection film 8 is smaller than the diameter 6b of the lands 6.

On the other hand, as shown in FIG. 6B, on the printed circuit board 10 side, the lands 11 are formed inside the edge of the opening 13a in the surface protection film 13, and the diameter 11b of the lands 11 is smaller than the diameter 13b of the opening in the surface protection film 13.

Breakage of an external terminal 9 due to temperature cycles occurs inside the external terminal 9 in the vicinity of its connection with the respective lands 6 or lands 11, where distortion concentrates. When, as in the second preferred embodiment shown in FIG. 5, the lands 11 on the printed circuit board 10 side is given a shape such that it projects into the external terminal 9, the rigidity of this connection vicinity becomes higher than the rigidity of the vicinity of the connection with the lands 6 on the semiconductor device 14 side.

When the balance of the rigidities of the parts connecting with the semiconductor device 14 side and with the printed circuit board 10 side is poor, distortion concentrates on one side and the life to breakage decreases; therefore, it is preferable to obtain a balance of the rigidities on the two sides.

Accordingly, a balance in the rigidities of the two connections is obtained by making the diameter LLP of the lands 11 on the printed circuit board 10 side smaller than the diameter 8b of the, opening in the surface protection film 8 on the semiconductor device 14 side.

As a result of this construction, as shown in FIG. 3, the life of the external terminals 9 is increased compared to a structure wherein the lands on neither the semiconductor device 14 side nor the printed circuit board 10 side project into the external terminals 9.

In experiments carried out by the present inventors, the life of the external terminals 9 in a temperature cycle test of trial production devices of a number of different specifications improved by as much as 10%.

Also, with the structure of the second preferred embodiment, compared to the structure of the example shown in FIG. 3, because the diameter LLP of the lands 11 on the printed circuit board 10 side can be made small, the distance between adjacent lands 13 can be increased. Therefore, the invention has the characteristic that the number of interconnections 12 passing between the adjacent lands 13 can be increased, or for the same number of interconnections, the land spacing can be narrowed to a smaller pitch.

In the semiconductor device of this invention, because a thin film-interconnection formation process constituting an extension of a wafer process is used for interconnection information, narrow pitches can be achieved by fine working. However, the issue arises that to match this on the printed circuit board 10 side it is necessary to use an expensive board. The structure of this preferred embodiment has the characteristic that it is possible to achieve a narrower pitch even with an inexpensive board, with which there is a limit to fine working.

Figure 7:
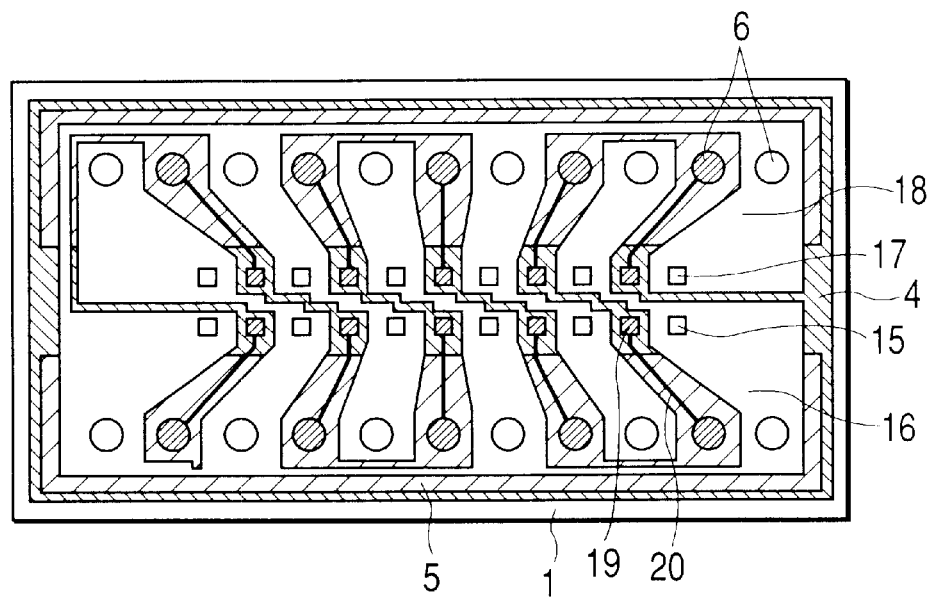
FIG. 7 is a plan view showing a semiconductor device of a third preferred embodiment of the invention.

FIG. 7 is a plan view showing a semiconductor device of the third preferred embodiment of the invention. The basic structure and materials are the same as in the first preferred embodiment, and the part of this third preferred embodiment which differs from the first preferred embodiment is the plan structure of the interconnections shown in FIG. 2. In the example of FIG. 7, the surface protection film 8 and the external terminals 9 shown in FIG. 2 have been omitted in order to show clearly the difference between this third preferred embodiment and the first preferred embodiment.

A characterizing feature of the third preferred embodiment of the invention is that power supply interconnections 18 and ground interconnections 16 led from power supply pads 17 and ground pads 15 provided on the semiconductor element 1 are made markedly thicker than signal interconnections 20 led from signal pads 19, and compared to the example of FIG. 2 the area occupied by these interconnections is markedly larger.

The main object of making these interconnections thicker is not only to reduce the resistances of the power supply and ground interconnections, but also to make sure that an interconnection of at least one of these two types is close to each of the signal interconnections 20. This has the effect of reducing various types of electromagnetic noise, such as simultaneous switching noise, arising when high-frequency signals of several hundreds MHz or more flow through the signal lines.

Figure 8:
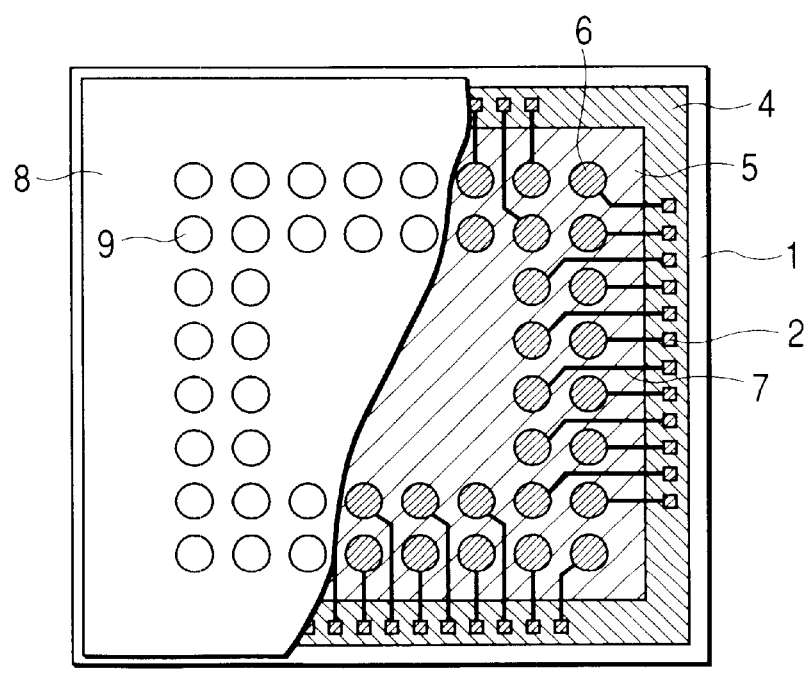
FIG. 8 is a plan view showing a semiconductor device of a fourth preferred embodiment of the invention.

FIG. 8 is a plan view showing a semiconductor device of the fourth preferred embodiment of the invention. The basic structure and materials are the same as in the first preferred embodiment, and the part of this fourth preferred embodiment which differs from the first preferred embodiment is that, whereas in the first preferred embodiment, shown in FIG. 2, the element electrodes 2 are lined up in the middle of the semiconductor element, in this fourth preferred embodiment, the element electrodes 2 are disposed along the sides of the semiconductor element.

The structure of the first preferred embodiment is suited to memory products, wherein the external terminals 9 are a few tens in number and are relatively few. The structure of this fourth preferred embodiment, on the other hand, is suited to microcomputer and logic LSI products, wherein the external terminals 9 are several hundreds in number.

Also, in this fourth preferred embodiment, the positional relationships of the passivation film 3, the insulating film 4, and the stress-moderating layer 5 around the element electrodes 2 are the same as in the first preferred embodiment. And, the edges of the stress-moderating layer 5 are formed with sloping faces, and the sloping edge faces are positioned away from the element electrodes 2.

The openings in the insulating film 4 are formed inside the, openings in the passivation film 3, and interconnections 7 led out from the element electrodes 2 immediately pass over the insulating film 4. Also, in this fourth preferred embodiment, as in the case of the first preferred embodiment, damage during dicing can be reduced by the edges of the resin layers being formed inside the edges of the semiconductor element 1. And, by making the surface protection film 8 thick at the element electrodes 2, it is possible to realize a semiconductor device superior in its blocking of α-rays and light.

In mounting the device to a printed circuit board 10, by adopting the relationship between the lands and the surface protection film shown in the second preferred embodiment, it is possible to increase the reliability of the external terminals 9 and narrow the pitch of the external terminals 9.

Also, by making the power supply interconnections and ground interconnections thick, as in the third preferred embodiment, it is possible to improve the reliability of the device with respect to electromagnetic noise.

Figure 9:
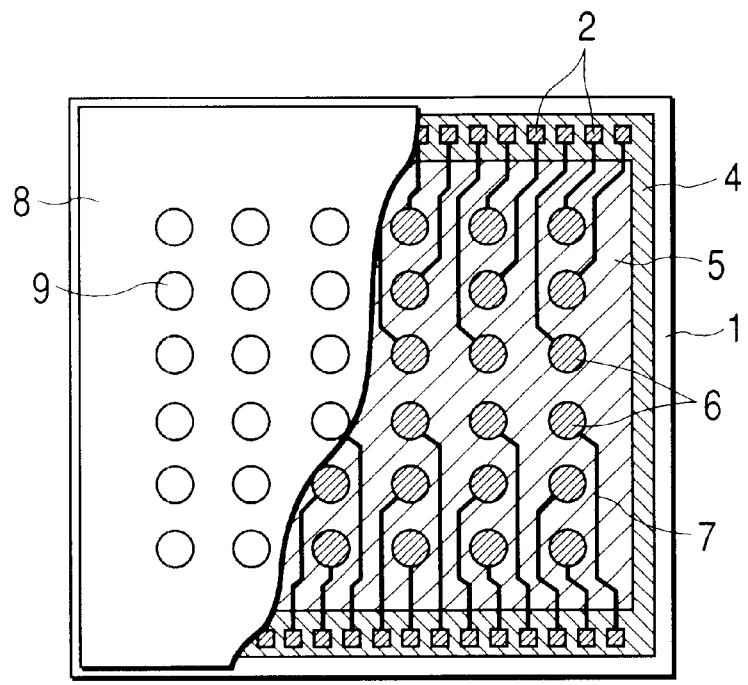
FIG. 9 is a plan view showing a semiconductor device of a fifth preferred embodiment of the invention.

FIG. 9 is a plan view of a semiconductor device of the fifth preferred embodiment. Although in this fifth preferred embodiment the element electrodes 2 are disposed along sides of the semiconductor element, as they are in the fourth preferred embodiment, it differs from the fourth preferred embodiment in that the element electrodes 2 are disposed only along two opposite sides out of the four sides. Otherwise, the fourth preferred embodiment and the fifth preferred embodiment are the same.

Thus, in each of the first, fourth and fifth preferred embodiments of the invention, a different disposition of the element electrodes 2 has been described; however, in a semiconductor device according to the invention the disposition of the element electrodes 2 is not limited to those of these first, fourth and fifth preferred embodiments.

Also, with dispositions other than those described above, even if the insulating film 4 is interposed between the interconnections 7 and the passivation film 3 in the vicinities of the element electrodes 2, as discussed in the description of the first preferred embodiment, the effects of the invention can be obtained.

In addition, multiple semiconductor devices according to the invention can be mounted to a printed circuit board. For example, multiple memory products having the structure of a semiconductor device according to the invention can be mounted on a board to make a memory module having a larger capacity or multiple semiconductor devices having different functions such as memory and microcomputer devices can be mounted on the same board to realize a module having more complicated functions.

Figure 10:
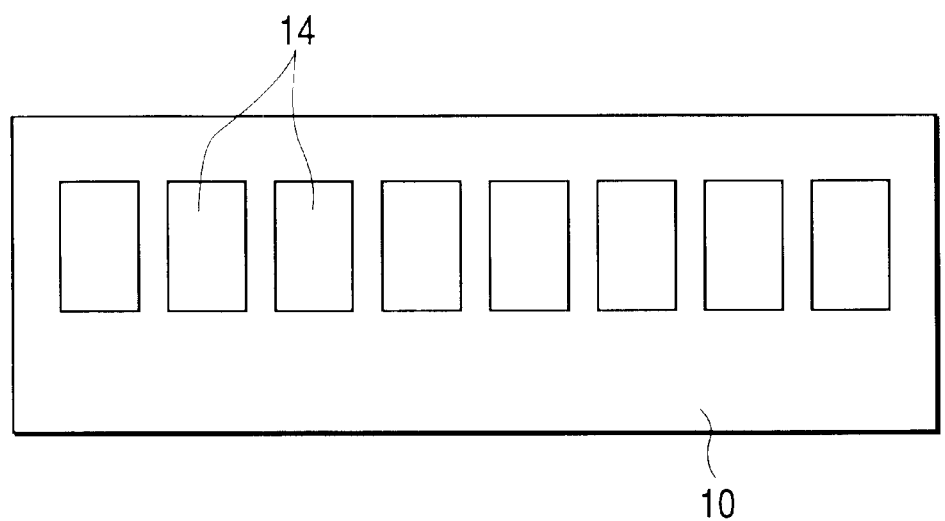
FIG. 10 is a plan view showing a semiconductor device board-mounting structure of a sixth preferred embodiment of the invention.

As an example of this, a plan view of a mounted semiconductor device structure constituting the sixth preferred embodiment is shown in FIG. 10. In this example, eight memory products are mounted on a printed circuit board to realize a memory module having a capacity of eight times that of a single memory device.

In a module like this, made up of multiple semiconductor devices according to the invention, because each of the devices has inside it a stress-moderating layer, the reliability of the external terminals with respect to temperature cycles is high. Consequently, it is not necessary to fill the space between the semiconductor devices and the printed circuit board with an underfill resin to reinforce the external terminals.

When underfill mounting is used, if an underfilled semiconductor device is defective, it is not possible to replace (repair) it, and, consequently, there is a risk of having to waste the board and any other, good chips mounted before the defective one.

On the other hand, when a module is constructed using semiconductor devices according to the present invention, the semiconductor devices can be repaired and this problem does not arise.

With this invention, it is possible to realize a semiconductor device having high reliability and excellent electrical characteristics which can be manufactured at the wafer level, and mounted arrangements of such semiconductor devices.

We claim:

1. A semiconductor device having a semiconductor element, comprising:
    an element electrode formed on the semiconductor element;
    an insulating layer formed on the semiconductor element;
    a stress-moderating layer formed on the insulating layer;
    a land formed so as to permit attachment of an external terminal on the stress-moderating layer;
    an interconnection to connect said element electrode arid said land,
    wherein one part of said interconnection is formed on said insulating layer and another part of said interconnection is formed on said stress-moderating layer, wherein a passivation layer is formed between said semiconductor element and said insulating layer, and wherein said insulating film prevents said interconnection from contacting said passivation layer.

2. A semiconductor device according to claim 1, wherein said insulating layer and stress-moderating layer each have an opening above said element electrode, and wherein an edge of said insulating layer is nearer to the center of said element electrode than an edge of said stress-moderating layer.

3. A semiconductor device having a semiconductor element, comprising:

an element electrode formed on a surface having said semiconductor element;

a passivation film formed on said surface having said semiconductor element, said passivation film having an opening above said element electrode;

a land formed so as to join to external terminals;

a stress-moderating layer interposed between said passivation film and said land and having an opening above said element electrode;

an insulating film interposed between said passivation film and said stress-moderating layer and having an opening above said element electrode; and interconnections electrically connecting said element electrode with said land;

wherein the distance from the center of said element electrode to an edge of said opening of said insulating film is smaller than the distance from the center of said element electrode to an edge of the opening of the stress-moderating layer and smaller than the distance from the center of the element electrode to an edge of said opening of said passivation film.

4. A semiconductor device according to claim 3, wherein the distance from the center of said element electrode to the edge of said opening of said passivation film is smaller than the distance from the center of said element electrode to the edge of said stress-moderating layer.

5. A semiconductor device according to claim 1, wherein said insulating layer is piled on the edge of said passivation layer for said element electrode.

6. A semiconductor device according to claim 1, wherein said insulation layer has a thickness of 3–20 um.

7. A semiconductor device according to claim 1, wherein the thickness of said stress-moderating layer is larger than the thickness of said insulation layer.

8. A semiconductor device according to claim 1, wherein the thickness of said insulating layer is larger than the thickness of said passivation layer.

9. A semiconductor device according to claim 1, wherein said insulating layer is adjacent to said one part of said interconnection located between said element electrode and an edge of the stress-moderating layer, and wherein said stress-moderating layer is adjacent to said other part of said interconnection located between said edge of said stress-moderating layer and said land.

10. A semiconductor device according to claim 9, wherein the edge of said stress-moderating layer for said element electrode at a first portion is nearer than the edge of said stress-moderating layer for said element electrode at a second portion located higher than said first portion.

11. A semiconductor device according to claim 1, wherein said insulating layer is formed of resin.

12. A semiconductor device according to claim 1, wherein said stress-moderating layer is formed of resin.

13. A semiconductor device according to claim 1, wherein said passivation layer is an inorganic layer.

14. A semiconductor device having a semiconductor element, comprising:

an element electrode having formed thereon an element passivation film formed on a surface of said semiconductor element, said element passivation film having an opening above said element electrode;

a land arranged so as to join to an external terminal;

a stress-moderating layer interposed between said passivation film and said land and having an opening above said element electrode;

an insulating film interposed between said passivation film and said stress-moderating layer and having an opening above said element electrode, an interconnection electrically connecting said element electrode with said land; and a surface protection layer formed on at least said element electrode, wherein the distance from the center of said element electrode to an edge of the opening of said insulating layer is smaller than the distance from the center of said element electrode to edges of said passivation film and said stress-moderating layer, and wherein said stress-moderation layer is formed inside an edge of said semiconductor element at the peripheral sides of said semiconductor element.

15. A semiconductor device according to claim 14, wherein said edge of said insulating layer and said surface protection film are inside said edge of said semiconductor element at the peripheral side of said semiconductor element.

16. A semiconductor device having a semiconductor element, comprising:

an element electrode and a passivation layer formed on the semiconductor element;

a first layer for electrically insulating formed on said passivation layer;

a second layer for stress-moderating formed on said first layer;

a land for attaching external terminals formed on said second layer; and interconnection means for connecting said element electrode and said land, said first layer keeping said interconnection means apart from said semiconductor element at an area between said passivation layer formed on the element electrode and the edge of said stress-moderating layer for said element electrode.

17. A semiconductor device according to claim 4, wherein the surface protection film is thicker over said element electrode where the stress-moderating layer is not covered than over a flat part of said stress-moderating layer.

18. A semiconductor device having a semiconductor element, comprising:

an element electrode formed on the semiconductor element;

an insulating layer formed on the semiconductor element;

a stress-moderating layer formed on the insulating layer;

a land formed so as to permit attachment of an external terminal on the stress-moderating layer;

an interconnection to connect said element electrode and said land, wherein one part of said interconnection is formed on said insulating layer and another part of said interconnection is formed on said stress-moderating layer, wherein said element electrode includes a power supply pad, a ground pad and a signal pad, and a power supply interconnection and a ground interconnection led out from said power supply pad and said ground pad are thicker than a signal interconnection led out from said signal pad.

19. A semiconductor device structure mounting the semiconductor device having a semiconductor element, comprising:

an element electrode formed on the semiconductor element;

an insulating layer formed on the semiconductor element;

a stress-moderating layer formed on the insulating layer;

a land formed so as to permit attachment of an external terminal on the stress-moderating layer;

an interconnection to connect said element electrode and said land, wherein one part of said interconnection is formed on said insulating layer and another part of said interconnection is formed on said stress-moderating layer, including a printed circuit board having conducting lands for said external terminals to be joined to, conducting interconnections interconnecting said lands, and a surface protection film formed at a surface of said printed circuit board with openings above said lands, said semiconductor device being mounted to said printed circuit board by way of said external terminals.

20. A semiconductor device structure mounting the semiconductor device according to claim 19, further comprising:

a surface protection film formed at said surface of said semiconductor device with openings above said lands, wherein said openings in the surface protection layer in said semiconductor device are formed inside said edges of said lands and the lands are formed inside said edges of said openings in said surface protection layer on said printed circuit board, and wherein the diameter of said lands on said printed circuit board is smaller than the diameter of said openings in said surface protection film on said semiconductor device.

21. A semiconductor device structure mounting the semiconductor device according to claim 19, wherein said openings in the surface protection layer in said semiconductor device are formed inside said edge of said lands, and said lands in the printed circuit board are formed inside said edges of said openings in said surface protection layer, and wherein the diameter of said lands on said printed circuit board is smaller than the diameter of openings in said surface protection layer in said semiconductor device.

22. A semiconductor device according to claim 2, wherein the distance from the center of said element electrode to the edge of an opening of said passivation film above said element electrode is larger than the distance from the center of said element electrode to the edge of said opening of said insulating film.

* * * * *